US006447854B1

(12) United States Patent
Rigney et al.

(10) Patent No.: US 6,447,854 B1
(45) Date of Patent: Sep. 10, 2002

(54) METHOD OF FORMING A THERMAL BARRIER COATING SYSTEM

(75) Inventors: David V. Rigney, Cincinnati; Antonio F. Maricocchi, Loveland, both of OH (US); David J. Wortman, Niskayuna, NY (US); Robert W. Bruce, Loveland; Joseph D. Rigney, Milford, both of OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/621,422

(22) Filed: Jul. 21, 2000

Related U.S. Application Data

(63) Continuation-in-part of application No. 09/108,201, filed on Jul. 1, 1998, now abandoned.

(51) Int. Cl.[7] ............................................. C23C 14/30
(52) U.S. Cl. ............. 427/596; 427/255.19; 427/255.31; 427/255.36
(58) Field of Search ................................ 427/585, 596, 427/255.19, 255.31, 255.36

(56) References Cited

U.S. PATENT DOCUMENTS

| 4,006,268 A | 2/1977 | Kennedy et al. ............... 427/42 |
| 4,676,994 A | 6/1987 | Demaray ...................... 427/42 |
| 5,059,095 A | 10/1991 | Kushner et al. ............. 416/241 |
| 5,087,477 A | 2/1992 | Giggins, Jr. et al. .......... 427/38 |
| 5,645,893 A * | 7/1997 | Rickerby et al. |
| 5,716,720 A | 2/1998 | Murphy ...................... 428/623 |

OTHER PUBLICATIONS

Rigney et al., Journal of Thermal Spray Technology, vol. 6, No. 2, Jun. 1997, pp. 167–175.*
Kreutz, E. W., et al.—A Comparative Study of ZrO2 Film Deposition by Electron and Laser Radiation—Jun. 14, 1993 (pp. 475–487).
D.V.Rigney et al., PVD Thermal Barrier Coating Applications and Process Development for Aircraft Engines, Journal of Thermal Spray Technology, vol. 6(2) (Jun. 1997), Opp. 167–175.

* cited by examiner

*Primary Examiner*—Timothy Meeks
(74) *Attorney, Agent, or Firm*—David L. Narciso; Gary M. Hartman; Domenica N. S. Hartman

(57) ABSTRACT

A method for producing a thermal barrier coating system on an article that will be subjected to a hostile environment. The thermal barrier coating system is composed of a metallic bond coat and a ceramic thermal barrier coating having a columnar grain structure. The method generally entails forming the bond coat on the surface of a component, and then grit blasting the bond coat with an abrasive media having a particle size of greater than 80 mesh. The component is then supported within a coating chamber containing at least two ingots of the desired ceramic material. An absolute pressure of greater than 0.014 mbar is established within the chamber containing oxygen and an inert gas. Thereafter, the ceramic ingots are vaporized with an electron beam such that the vapor deposits on the surface of the component to form a layer of the ceramic material on the surface.

20 Claims, 4 Drawing Sheets

METHOD OF FORMING A THERMAL BARRIER COATING SYSTEM

CROSS REFERENCE TO RELATED APPLICATIONS

This is a continuation-in-part patent application of U.S. patent application Ser. No. 09/108,201, filed Jul. 1, 1998 now abandoned.

STATEMENT REGARDING FEDERALLY SPONSORED RESEARCH

This invention was made with Government support under Agreement No. N00019-92-C-0149 awarded by the U.S. Department of the Navy. The Government has certain rights in the invention.

FIELD OF THE INVENTION

This invention relates to thermal barrier coatings for components exposed to high temperatures, such as the hostile thermal environment of a gas turbine engine. More particularly, this invention is directed to a method for forming a thermal barrier coating system that exhibits improved resistance to spalling and low thermal conductivity.

BACKGROUND OF THE INVENTION

Higher operating temperatures of gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys, though such alloys alone are often inadequate to form components located in the hot sections of a gas turbine engine, such as the turbine, combustor and augmentor. A common solution is to thermally insulate such components in order to minimize their service temperatures. For this purpose, thermal barrier coatings (TBCs) formed on the exposed surfaces of high temperature components have found wide use.

To be effective, TBCs must have low thermal conductivity, be capable of being strongly adhered to the article, and remain adherent through many heating and cooling cycles. The latter requirement is particularly demanding due to the different coefficients of thermal expansion between materials having low thermal conductivity and superalloy materials used to form turbine engine components. For this reason, TBCs have generally employed a metallic bond coat deposited on the surface of a superalloy component. A thermal-insulating layer (the TBC) is then deposited on the bond coat, which together form what is termed a TBC system. The metallic bond coat is typically a diffusion aluminide or an oxidation-resistant alloy, such as MCrAlY where M is iron, cobalt and/or nickel, which promotes the adhesion of the insulating layer to the component while also inhibiting oxidation of the underlying superalloy.

Various ceramic materials have been employed as the TBC, particularly zirconia ($ZrO_2$) stabilized by yttria ($Y_2O_3$), magnesia (MgO) or other oxides. These particular materials are widely employed in the art because they can be readily deposited by plasma spray, flame spray and vapor deposition techniques. A continuing challenge of TBC systems has been the formation of a more adherent ceramic layer that is less susceptible to spalling when subjected to thermal cycling. For this purpose, the prior art has proposed various coating systems, with considerable emphasis on ceramic layers having enhanced strain tolerance as a result of the presence of porosity, microcracks and segmentation of the ceramic layer. Segmentation indicates that the ceramic layer has columnar grain boundaries or cracks oriented perpendicular to the surface of the component, and is achieved with electron beam physical vapor deposition (EBPVD) techniques. As is known in the art, a TBC having a columnar grain structure is able to expand with its underlying substrate without causing damaging stresses that lead to spallation, as evidenced by thermal cyclic testing.

Zirconia-based TBCs, and particularly yttria-stabilized zirconia (YSZ) coatings having columnar grain structures and a thickness on the order of about 125 micrometers (about 0.005 inch) or more are widely employed in the art for their desirable thermal and adhesion characteristics. Processes for producing YSZ coatings with EBPVD techniques generally entail suspending a component in a coating chamber above one or more YSZ ingots, and then melting a surface of the ingot(s) with an electron beam to generate a vapor of zirconium, yttrium and oxygen ions and nonstoichiometric metal oxides that recombine to form a YSZ coating on the component surface. The deposition rate and the throughput of components are generally limited by the size of the coating zone within the coating chamber. As used herein, the "coating zone" is the volume within the coating chamber over which an allowable variation of deposition rates is established, usually within about ±10%. The deposition rate can be taken as the average deposition rate over the entire coating zone.

The coating chamber is conventionally evacuated and then backfilled with oxygen or a mixture of oxygen and an inert gas (typically argon) to maintain a pressure of 0.005 mbar or less during the coating operation. When depositing a TBC of a metal oxide such as YSZ, the addition of oxygen is for the purpose of providing excess oxygen ions, which ensures that near-stoichiometric oxides (e.g., zirconia and yttria) are formed. Low chamber pressures are employed to avoid adversely affecting the operational characteristics of the electron beam gun and the baffling chambers used therewith. More particularly, higher pressures are avoided because control of the electron beam is more difficult at pressures above about 0.005 mbar, with erratic operation being reported at coating chamber pressures above 0.010 mbar. It has also been believed that the life of the gun filament would be reduced or the gun contaminated if operated in pressures above 0.005 mbar.

While greater coating pressures have been reported for EBPVD operations, such as in U.S. Pat. Nos. 4,006,268 to Kennedy et al., U.S. Pat. No. 5,645,893 to Rickerby et al., and U.S. Pat. No. 5,716,720 to Murphy, the 0.005 mbar upper pressure limit has been largely adhered to by those skilled in the art when depositing ceramic TBCs. Notably, Kennedy et al. are concerned with depositing metal coatings, and teach that higher pressures collimate the vapor produced when evaporating a single metal ingot by EBPVD. Therefore, according to Kennedy et al., higher pressures yield a more focused path between the ingot and the targeted surface, which is said to increase the efficiency of the coating process. However, the uniform coating zone resulting from Kennedy's process is limited in size by the collimated vapor. Also of note is that, while Rickerby et al. and Murphy are concerned with depositing YSZ coatings, Rickerby et al. limit their pressures of 0.013 mbar, Murphy uses only oxygen as the coating atmosphere and, as with Kennedy et al., both are limited to evaporating a single ingot.

Though YSZ deposited by EBPVD is a highly successful coating system for protecting turbine engine components, there is an ongoing effort to improve the spallation resistance and reduce the thermal conductivity of TBCs, and to deposit such coatings by more efficient processes.

BRIEF SUMMARY OF THE INVENTION

The present invention is a method for producing a thermal barrier coating system on an article which will be subjected to a hostile environment that promotes spallation, as is the case with turbine, combustor and augmentor components of a gas turbine engine. The coating system is composed of a metallic bond coat and a thermal barrier coating (TBC) having a columnar grain structure. According to the invention, the bond coat is prepared and the TBC subsequently deposited by electron beam physical vapor deposition (EBPVD) by an improved coating process whose parameters significantly improve spallation resistance and reduce the thermal conductivity of the TBC.

The method of this invention generally entails establishing an absolute pressure of at least 0.014 mbar within a coating chamber with a gas (or gas mixture) that preferably includes oxygen and an inert gas, though an oxygen-free coating atmosphere is also within the scope of this invention. A metal oxide ceramic material is then evaporated with electron beams focused on at least two masses (e.g., ingots) of the ceramic material so as to produce a vapor of metal ions, oxygen ions and one or more nonstoichiometric metal oxides. According to the invention, the vapor is diffuse relative to the ingots of ceramic material as a result of the elevated pressure, and travels upwardly and outwardly from the mass toward a component above the mass within the coating chamber. The metal and oxygen ions and nonstoichiometric metal oxides recombine to form a layer of the ceramic material on the surface.

Contrary to Kennedy et al., under these conditions the ceramic material evaporates to form an ion vapor that is not collimated, but instead is diffuse relative to the ceramic ingots, allowing for more parts to be simultaneously coated. A metal oxide TBC deposited in accordance with this invention is porous and tenaciously adheres to a bond coat, and surprisingly is significantly more spall resistant than TBCs deposited under conventional conditions, i.e., lower chamber pressures and a single ingot of ceramic material. Also unexpected is that the coating deposition rate is dependent on chamber pressure, with higher pressures corresponding to higher deposition rates and more efficient usage of ceramic material, i.e., more ceramic deposited on a turbine component per unit length of ingot consumed (volume evaporated). Accordingly, the method of the present invention not only improves the spallation resistance of the resulting TBC, but also improves manufacturing economies.

Other objects and advantages of this invention will be better appreciated from the following detailed description.

DETAILED DESCRIPTION OF THE INVENTION

The present invention is generally directed to a method for depositing a thermal barrier coating (TBC) on a metal component intended for operation within an environment characterized by high temperatures. Notable examples of such components include the high and low pressure turbine nozzles and blades, shrouds, combustor liners and augmentor hardware of gas turbine engines. While the advantages of this invention will be described with reference to turbine blades of gas turbine engines, the teachings of this invention are generally applicable to any component in which a TBC can be used to insulate the component from a hostile thermal environment.

Figure 1:
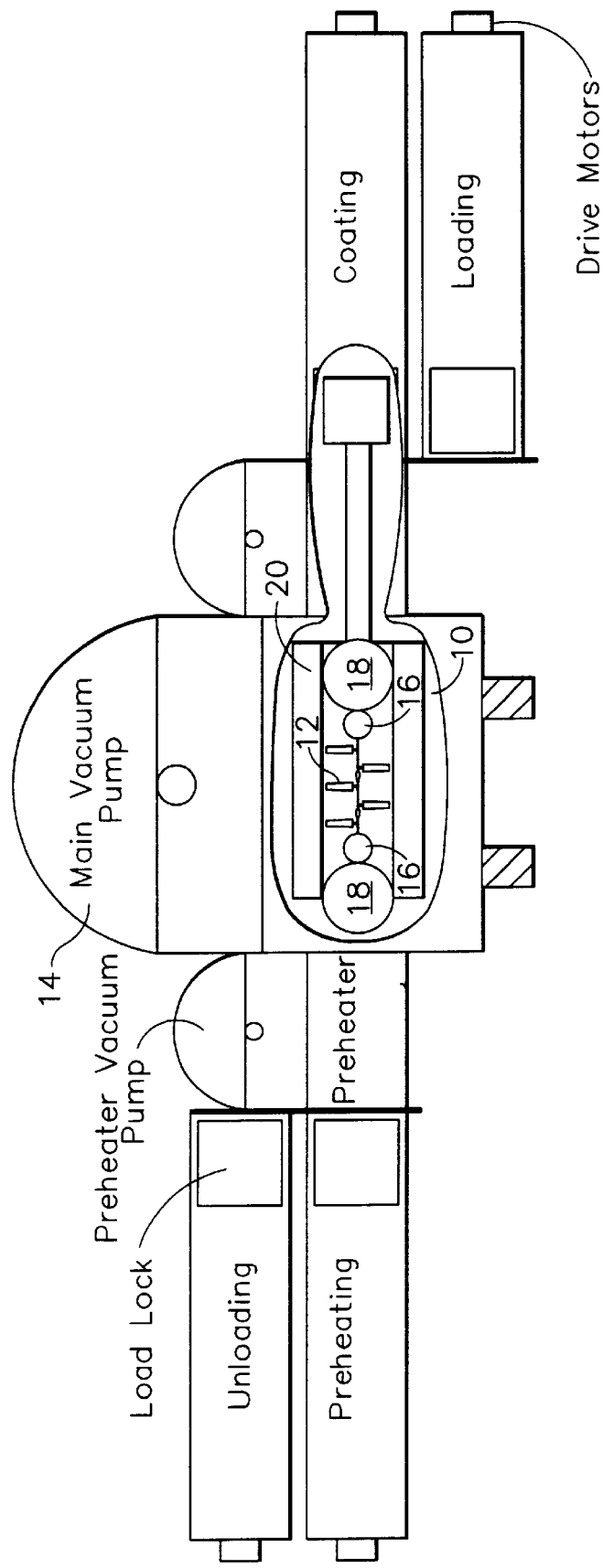
FIG. 1 shows a schematic representation of an electron beam physical vapor deposition apparatus used to deposit a thermal barrier coating in accordance with this invention.

To illustrate the invention, the coating chamber 10 of an electron beam physical vapor deposition (EBPVD) coating apparatus is shown in FIG. 1. Shown supported within the coating chamber 10 are turbine blades 12 of a gas turbine engine. Coating chambers of the type shown in the Figure are typically capable of being maintained at a vacuum level of about $1 \times 10^{-3}$ Torr (about 0.001 mbar) or less. A vacuum pump 14 of a type known in the art is employed to evacuate the chamber 10 during the deposition process.

As is generally conventional, the blades 12 may be formed of a nickel-base or cobalt-base superalloy. Each blade 12 includes an airfoil section against which hot combustion gases are directed during operation of the gas turbine engine, and whose surface is therefore subjected to hostile thermal and chemical environment. For this reason, a TBC system is adherently formed on the surface of the blade 12 to protect its superalloy substrate. As is generally typical in the art, the coating system is composed of a metallic bond coat over which a ceramic TBC is formed. The bond coat is preferably an oxidation-resistant metal composition that protects the underlying superalloy substrate from oxidation and enables the TBC to more tenaciously adhere to the substrate. Suitable bond coat materials include diffusion aluminide containing intermetallic platinum and/or nickel aluminide phases, and MCrAlY alloys such as NiCrAlY. The thickness for a diffusion aluminide bond coat is at least about 25 micrometers, with a suitable range being about 50 to 75 micrometers. A typical thickness range for MCrAlY bond coats is about 25 to 375 micrometers.

Following deposition of the bond coat, the surface of the bond coat is prepared for deposition of the TBC by abrasive grit blasting. In the past, grit blasting with 80 mesh or finer alumina particles has been preferred as the abrasive medium to clean the bond coat surface and produce the smooth surface finish required for narrow, parallel columnar PVD TBCS. However, according to this invention a coarser abrasive medium has been unexpectedly found to promote the adhesion of the TBC to the bond coat. A particle size of about 250 to about 300 micrometers is suitable, with a preferred particle size being about 54 mesh (about 275 micrometer). The abrasive medium is preferably discharged under a pressure of about 55 psi or more at a standoff distance of about 7 to about 10 inches (about 17.5 to about 25.4 centimeters) from a standard unit used for this purpose. Thereafter, an alumina scale is formed on the bond coat at an elevated temperature to promote adhesion of the TBC. The alumina scale, often referred to as a thermally grown oxide or TGO, develops from oxidation of the aluminumcontaining bond coat either through exposure to elevated temperatures during deposition of the TBC, or by way of a high temperature treatment specifically performed for this purpose.

Finally, the TBC is deposited by EBPVD under conditions that were unexpectedly determined to have a significant effect on the spall resistance and thermal conductivity of the coating. As well known in the art, the TBC is represented in FIG. 1 as being deposited from a vapor formed by melting and vaporizing ingots 16 of the desired TBC material with electron beams generated by an appropriate number of electron beam guns 18. The guns 18 are preferably linear, meaning that the beams are deflected by less than 50 degrees, as compared to about 270 degrees for guns of the type used by Kennedy et al. and others. A preferred TBC material is YSZ, which as used here denotes zirconia ($ZrO_2$) partially or fully stabilized by yttria (e.g., 3%–20%, preferably 4%–8% $Y_2O_3$), though zirconia stabilized with magnesia, ceria, calcia, scandia or other oxides could be used. The blades 12 are preferably secured to a rotatable support 20 of a type known in the art, and the ingots 16 are located within the chamber 10 such that their upper ends are adjacent the blades 12. The electron beams emitted by the guns 18 are directed toward the upper ends of the ingots 16, which causes the surfaces of the ingots 16 to melt and form molten pools of the TBC material. Intense heating of the ingots 16 by the electron beams ionizes the TBC material, by which the constituents of the material dissociate. As such, with the use of YSZ ingots 16, a vapor is formed containing zirconium ions, yttrium ions, oxygen ions and nonstoichiometric metal oxides. The vapor travels upwardly and, on contact with the blades 12, the ions and nonstoichiometric metal oxides recombine to deposit a near-stoichiometric YSZ layer on the surfaces of the blades 12. A heater (not shown) may be positioned above the blades 12 to provide additional heating as may be required to supplement the heat provided by the vaporized TBC material and the radiation from the molten surface of the ingots 16. In this manner, the blades 12 are brought to a suitable deposition temperature of about 925° C. to about 1140° C. A stable blade temperature promotes the desired columnar grain structure for the ceramic layer in which the longitudinal axis of each grain is roughly perpendicular to the surface of each blade 12.

In the prior art, a vacuum of at most 0.010 mbar, and more often about 0.005 mbar or less, would typically be drawn within the chamber 10 to perform the coating process, the reason being that higher pressures were known to cause erratic operation of the electron beam guns 18 and make the electron beams difficult to control, with the presumption that inferior coatings would result. However, according to this invention, the coating chamber 10 is operated at a pressure of at least 0.014 mbar, which yields a TBC layer having a feathery columnar microstructure and characterized by improved spallation and impact resistance. The elevated coating pressure also increases the coating deposition rate in conjunction with higher ingot evaporation rates than that achieved in the prior art. Contrary to Kennedy et al., the vapor of ions is not collimated, but instead is diffuse relative to the ingots 16, i.e., the vapor flows upwardly and outwardly from the ingots 16, which allows more blades 12 to be simultaneously coated. For example, a coating zone measuring about 140×420 mm has been achieved using two ingots 16 with diameters of only about 63 mm. While not wishing to be held to any particular theory, this distinction is believed to be attributable to the different coating materials (ceramic vs. metal, with considerably different melting temperatures), the greater number of molten pools (two ingots 16 vs. one), and the different electron beam guns employed by this invention.

During a preliminary investigation leading to the present invention, conventional (baseline) coating parameters were evaluated with test specimens formed of René N5 superalloy (nominal composition in weight percent: 7.5Co, 7.0Cr, 1.5Mo, 5.0W, 3.0Re, 6.5Ta, 6.2Al, 0.15Hf, 0.05C, 0.004B, 0.01Y, balance Ni). PtAl bond coats were formed on the specimens by platinum plating followed by vapor phase aluminizing, and their surfaces prepared with either 36, 54 or 80 mesh alumina abrasive media discharged at pressures of 40, 70 and 60 psi, respectively (about 0.28, 0.41 and 0.48 MPa, respectively). The different discharge pressures served to achieve a similar surface roughness or texture (about 50 to 60 μinches Ra) for each of the specimens. The specimens were then coated with YSZ by EBPVD using the following parameters: coating temperature of about 1000° C., coating pressure of about 0.012 mbar, and an ingot feed rate of about 2.1 mm/minute using two ingots having diameters of about 6.35 cm (yielding an evaporation rate of about 24.6 grams/minute per ingot, for a combined evaporation rate of about 49.2 g/minute). Furnace cycle testing (FCT) was then performed on the specimens at 2075° F. (about 1135° C.) with one-hour cycles, with specimens being removed from test once 10% of the coating surface area had spalled. On average, the specimens whose bond coats were surface treated with 36 mesh abrasive media exhibited an average FCT life of 493 cycles, while those treated with 54 and 80 mesh media exhibited FCT lives of about 593 and 540 cycles, respectively.

Based on the above promising results, a second investigation was then pursued to evaluate various coating parameters with test specimens formed of Inconel 601 superalloy (nominal composition in weight percent: 23Cr, 1.4Al, 0.5Mn, 0.05C, 0.25Si, balance Ni). The coating parameters included preheat temperatures of about 900° C. to about 1100° C., coating temperatures of about 1000° C. to about 1150° C., component rotational speeds of about 6 to about 60 rpm, ingot feed rates of about 1.3 to about 2.5 mm/minute for each of two ingots with diameters of about 6.35 cm (equivalent to an evaporation rate of about 15.2 to about 29.2 grams per minute per ingot, for a combined ingot evaporation rate of about 30.3 to about 58.5 g/minute), and coating chamber pressures of about 0.001 to about 0.0195 mbar. Attempts to deposit coatings at chamber pressures above 0.020 mbar resulted in operation difficulties, including excessive pressure and beam variations and excessive "spitting" from the molten ceramic pools at the upper ends of the ingots, the results of which were inconsistent coatings. All specimens were provided with a diffusion aluminide bond coat having a thickness in the range of about 25 to about 75 micrometers. The bond coats were surface prepared with 80 mesh alumina abrasive media discharged at a pressure of about 60 psi (about 0.41 MPa).

Deposition of the TBC on each specimen was performed in two coating chambers similar to that shown in FIG. 1. The specimens were preheated to about 900° C. to about 1100° C., after which the coating process brought the specimens to the coating temperatures indicated above. As was expected, the operation of the guns significantly changed over the range of pressures tested. At the lower pressures (e.g., 0.001 mbar), the focus effects were more gradual and easier to control, and it was observed that high evaporation rates could be maintained without excessive spitting of the molten ceramic pools. At pressures of 0.015 and 0.0195 mbar, the focus changes were much more critical, with small focus changes producing significant changes in evaporation rate.

High ingot feed rates (e.g., 2.5 mm/minute per ingot, equivalent to a combined evaporation rate of 58.5 g/minute when using two ingots) required sharper focus adjustments, and the melt became more prone to excessive spitting and violent gas eruptions. Feed rates of 2.1 mm/minute per ingot (about 24.6 g/minute per ingot) reduced spitting to a level acceptable for the experiment.

The results of FCT testing performed on specimens processed with the above coating parameters are summarized below in Table I. Preheat temperature and rotational speeds are not indicated in Table I—generally, preheat temperatures of 1100° C. had a positive effect, while rotational speeds did not appear to have any effect on coating results.

TABLE I

| Chamber Pressure (mbar) | Coating Temp. (°C.) | Ingot Feed Rate (mm/min.) | Total Feed Rate (g/min.) | Coating Thickness per mm ingot used ($\mu$m/mm) |
|---|---|---|---|---|
| 0.000959 | 1013 | 1.32 | 30.9 | 2.92 |
| 0.000975 | 1112 | 2.02 | 47.3 | 4.57 |
| 0.007815 | 1054 | 2.25 | 52.6 | 4.45 |
| 0.007877 | 1137 | 2.27 | 53.1 | 3.91 |
| 0.007898 | 1090 | 2.10 | 49.2 | 4.60 |
| 0.01423 | 1032 | 1.33 | 31.1 | 4.85 |
| 0.0143 | 1099 | 1.33 | 31.1 | 6.53 |
| 0.0195 | 1138 | 2.28 | 53.4 | 6.99 |

The above results evidenced that deposition efficiencies (indicated by the amount of coating deposited per unit length of ingot consumed) substantially increased with higher coating chamber pressures. Such a result was unexpected, and was the basis for initiating further investigation into the effects of using deposition chamber pressures above that conventionally used in the art, e.g., above 0.005 mbar.

Subsequent testing was performed on test specimens formed of Inconel 601 and René N5 superalloys. A preheat temperature of 1100° C. and a coating rotational speed of 6 rpm were employed throughout this phase of tests. Test parameters evaluated were coating temperatures of 1000 to 1150° C., ingot feed rates of about 1.3, 1.7 or 2.1 mm/minute using two ingots with diameters of about 6.35 cm (an evaporation rate of about 15.2, 19.9 or 24.6 g/minute per ingot, for a combined evaporation rate of about 30.3, 39.8 or 49.2 g/minute), oxygen partial pressures of 0% to 100% (the balance argon), and coating chamber pressures of about 0.001 to about 0.015 mbar. All René N5 specimens were provided with a platinum aluminide (PtAl) bond coat having a thickness of about 1.3 to 3 mils (about 33 to 76 micrometers), while the Inconel 601 specimens were provided with a diffusion aluminide bond coat having a thickness of about 0.9 to 2.5 mils (about 23 to 64 micrometers). The bond coats were surface prepared with either 54 mesh alumina abrasive media discharged at a pressure of about 70 psi (about 0.48 MPa) or 80 mesh alumina abrasive media discharged at about 60 psi (about 0.41 MPa), again the different pressures serving to achieve similar surface roughnesses or textures for all specimens. The specimens were then vacuum heat treated for two hours at about 1950° F. (about 1066° C.).

The coating process was controlled such that about 1055 grams of ingot was evaporated. During coating, no significant difference in "spitting" was observed at the different parameters. Following deposition of the TBC, spallation resulting from process causes was observed with four specimens, three of which were coated at pressures of 0.001 mbar and the fourth was coated at a low temperature (about 950° C.) with no oxygen flowing in the system. Some of the remaining specimens were examined for coating thickness, while others underwent furnace cycle testing at about 2075° F. (about 1135° C.) with one-hour cycles.

Figure 2:
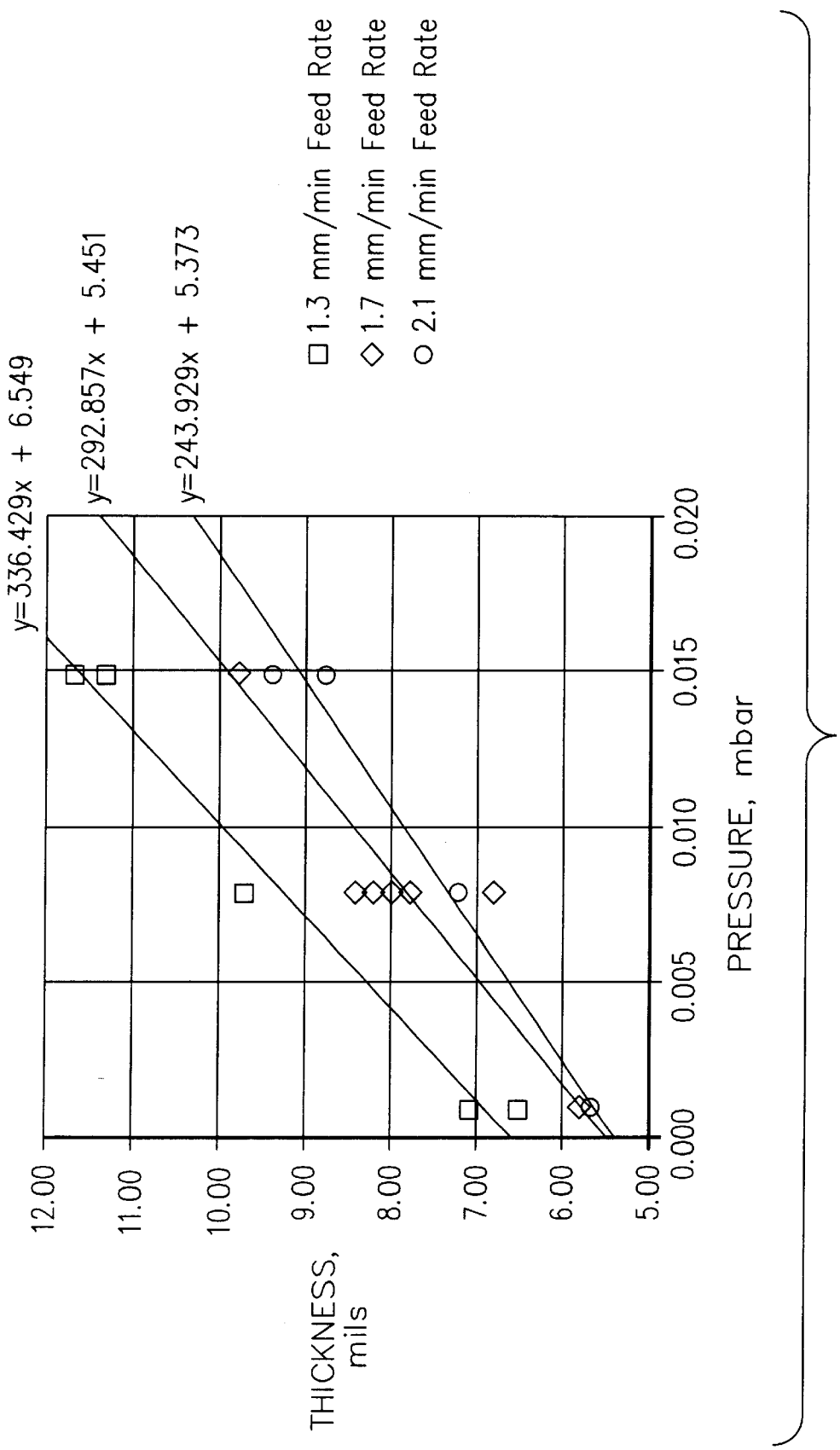
FIG. 2 is a graph indicating a correlation between TBC thickness and coating chamber pressure and ingot feed (evaporation) rate.

The average coating thickness for all specimens was about 125 micrometers. Those specimens whose bond coats were surface treated with 54 mesh abrasive had an average coating thickness of 1.9% greater than the overall average, and those whose bond coats were surface treated with 80 mesh abrasive had an average coating thickness of 2.7% less than the overall average. Since all specimens were exposed to the same coating conditions, these differences in coating thickness translated to differences in porosity within the coating, which was unexpected but beneficial to reducing internal coating stress and lowering thermal conductivity. Coating temperature and oxygen partial pressure did not significantly affect coating thickness. In contrast, a marked correlation was made when compared on the basis of total coating chamber pressure and ingot feed (evaporation) rate. Increased total coating chamber pressure (from 0.001 to 0.015 mbar) increased coating thickness, while increased feed rates (from 1.3 to 2.1 mm/minute per ingot, or 15.2 to 24.6 g/minute per ingot) resulted in lower deposition rates per quantity of ingot used, regardless of chamber pressure. These relationships are represented in FIG. 2, and evidence an interaction that has a substantial economic effect of the EBPVD process itself. Specifically, deposition times can be reduced and deposition efficiencies (amount of ceramic deposited per unit of ingot consumed) improved with higher coating pressures.

Figure 4:
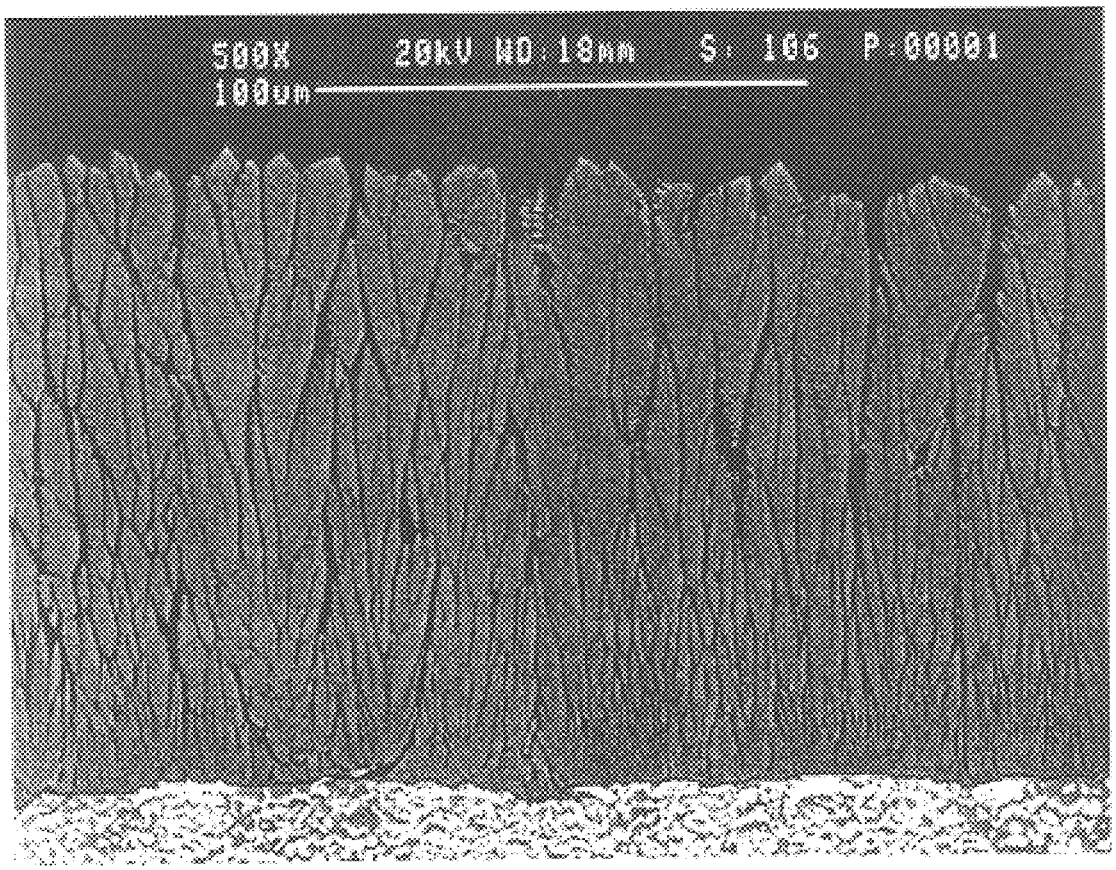
FIG. 4 is a microphotograph showing feather-like columnar grains associated with coatings deposited at coating chamber pressures in accordance with this invention.

Metallographic examinations of the specimens showed that all TBCs had columnar microstructures, as would be expected from the EBPVD process used. However, the particular structure of the grains appeared to be dependent on the coating pressure. Fern-like or feather-like columnar grains shown in FIG. 4 were more often associated with coatings deposited at high total coating chamber pressures (0.015 mbar) using a mixture of oxygen and argon.

The FCT schedule entailed the completion of twenty one-hour cycles per day over a period of about three months with over 200 specimens. A specimen was removed from test once 10% of the coating surface area had spalled. The results of the FCT test are tabulated in Table II below.

TABLE II

| Chamber Pressure (mbar) | Coating Temp. (°C.) | Ingot Feed Rate (mm/min.) | $O_2$ Part. Press. (%) | FCT Life 54 Mesh (cycles) | FCT Life 80 Mesh (cycles) |
|---|---|---|---|---|---|
| 0.001 | 1000 | 1.3 | 0 | 225 | 420 |
| 0.001 | 1000 | 2.1 | 0 | 493 | 420 |
| 0.001 | 1075 | 1.7 | 50 | 593 | 487 |
| 0.001 | 1150 | 1.3 | 100 | 480 | 506 |
| 0.001 | 1150 | 2.1 | 100 | 646 | 520 |
| 0.008 | 1000 | 1.7 | 50 | 500 | 493 |
| 0.008 | 1075 | 1.3 | 50 | 753 | 446 |
| 0.008 | 1075 | 1.7 | 0 | 480 | 333 |
| 0.008 | 1075 | 1.7 | 50 | 686 | 566 |
| 0.008 | 1075 | 1.7 | 50 | 526 | 420 |
| 0.008 | 1075 | 1.7 | 100 | 486 | 533 |
| 0.008 | 1075 | 2.1 | 50 | 700 | 386 |
| 0.008 | 1150 | 1.7 | 50 | 693 | 573 |
| 0.015 | 1000 | 1.3 | 100 | 660 | 446 |
| 0.015 | 1000 | 2.1 | 100 | 673 | 466 |
| 0.015 | 1075 | 1.7 | 50 | 646 | 440 |
| 0.015 | 1150 | 1.3 | 0 | 433 | 406 |
| 0.015 | 1150 | 2.1 | 0 | 560 | 486 |

Figure 3:
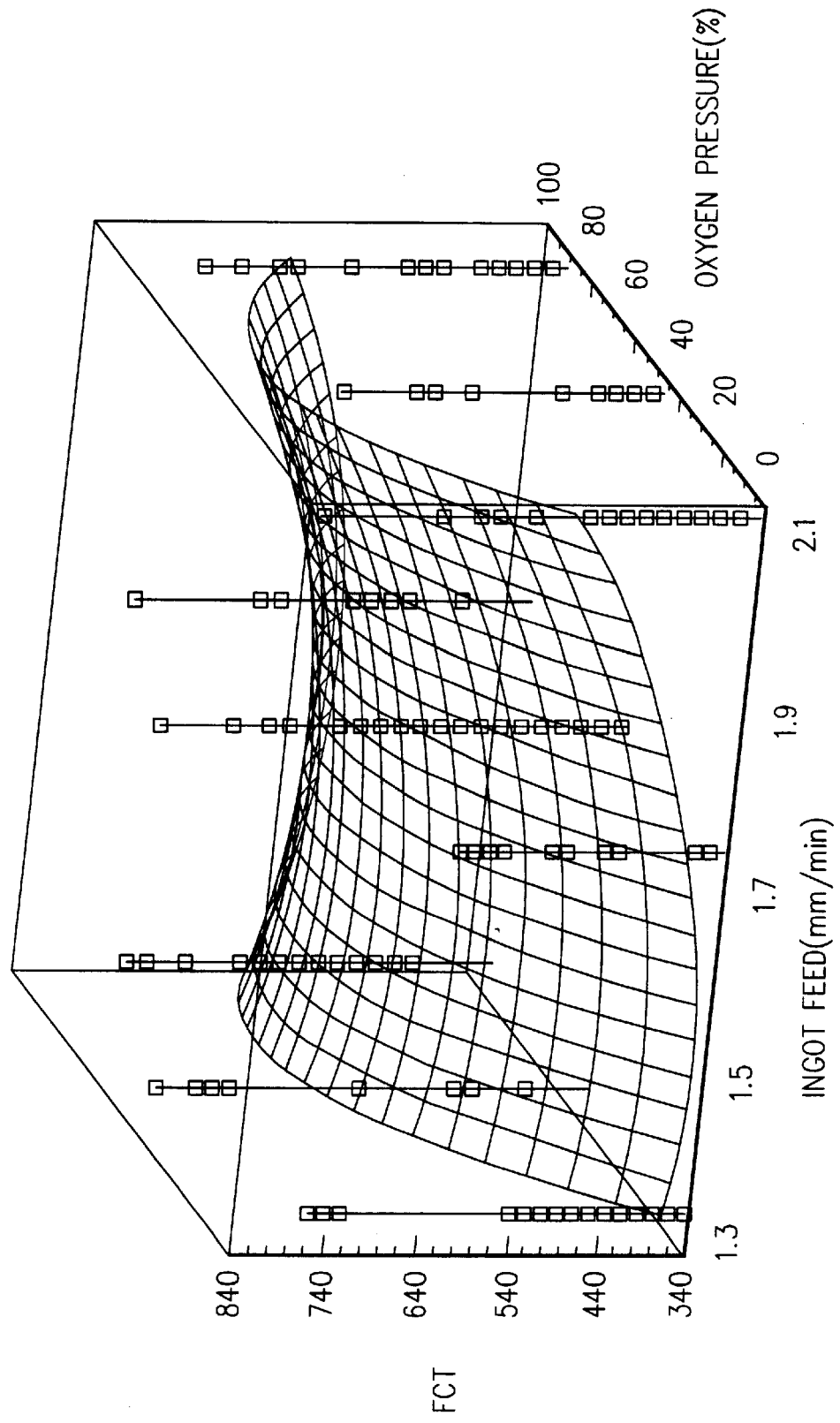
FIG. 3 is a graph indicating a strong correlation between %$O_2$ of total pressure on FCT life in relation to ingot feed (evaporation) rate.

The above results evidence a strong correlation between total coating chamber pressure, evaporation rate, oxygen partial pressure and grit media used with FCT life. When analyzed on the basis of bond coat surface treatment, those specimens treated with the 54 mesh media exhibited an average FCT life of 569 cycles, as compared to 463 cycles for the 80 mesh specimens. Eliminating the results obtained at 0.001 mbar pressure and "0%" oxygen conditions evidenced an even more consistent correlation between FCT life and bond coat surface preparation, yielding average FCT lives for the 54 and 80 mesh specimens of 632 and 477 cycles, respectively. Under this analysis, the 54 mesh grit surface preparation technique exhibited an approximately 32% FCT life improvement over the 80 mesh specimens. Furthermore, with "0%" oxygen specimens eliminated, the average FCT life for specimens grit blasted with 54 mesh media and coated at 0.015 mbar was 660 cycles, as compared to an average life of 573 for specimens coated at 0.001 mbar (an improvement of about 15%). Finally, FIG. 3 shows the strong influence that oxygen partial pressure had on FCT life in relation to ingot feed rates between 1.3 and 2.1 mm/minute (evaporation rates of 15.2 to 24.6 g/minute per ingot, for a combined evaporation rate of 30.3 to 49.2 g/minute).

Statistical analysis of the results verified that the most important factors determining FCT life (2075° F., one-hour cycles) were oxygen partial pressure, ingot evaporation rate and total coating chamber pressure, with pressure being the greatest single factor. Analysis of the FCT life data on the basis of these parameters gave the following regression:

$$FCT \text{ life}=1309.7+30236(P)-1407(R)+8.15(O)-13318(P)(R)+484(R)^2-0.066(O)^2$$

where:

"FCT life" is in hours;

"P" is total coating chamber pressure in mbars;

"R" is ingot evaporation rate is in mm/minute for each 6.35 cm diameter ingot (ceramic source); and "O" is oxygen partial pressure in percent of total coating chamber pressure.

Goodness of fit ($R^2$) for this equation was 74%, and $R^2$ adjusted was 60%. This analysis predicts that, using a preferred evaporation rate of 6.35 to 7.9 cm$^3$/minute per ingot (equivalent to an evaporation rate of about 23.5 to 29.2 grams/minute per ingot, for a combined evaporation rate of about 47.0 to 58.5 g/minute), parameters for FCT life are an oxygen partial pressure of about 60%, more precisely about 61.4%, and a total coating chamber pressure of about 0.012 mbar, more precisely about 0.0117 mbar, and would yield an average (Xbar) FCT life of about 878 cycles.

The effect that the coating process parameters of this invention have on coating erosion and impact resistance was also evaluated. In service, TBCs on gas turbine engine components are required to withstand damage from impact by hard particles of varying sizes that enter the high velocity gas stream through the air intake of a gas turbine engine, or are generated upstream in the engine. The result of impingement can be erosive wear (generally from smaller particles) or impact spallation from larger particles.

A test developed to measure the relative performance of coatings at high temperatures (2250° F., 1232° C.) and high gas velocities (Mach 0.3) was modified to allow the injection of an alumina powder to evaluate erosion and impact resistance. Alumina powders with average particle sizes of about 50 micrometers and about 560 micrometers were used to evaluate erosion and impact resistance, respectively. Pin specimens of 0.25 inch diameter (about 6.35 mm) were formed of René N5 and then coated with a PtAl bond coat and a five mil (125 micrometers) thick EBPVD TBC. The specimens were rotated at a rate of about 500 rpm during the experiment. Erosion resistance was measured in terms of the number of grams of erodent required to break through the TBC to the underlying bond coat.

The TBCs were processed in coating chambers maintained at an absolute pressure of either 0.006 or 0.012 mbar, with a feed rate of either about 1.7 or 2.1 mm/minute per ingot (equivalent to an evaporation rate of 20 or 24.6 g/minute per ingot, or a combined evaporation rate of 40 or 49.2 g/minute), and an oxygen partial pressure of either about 100% or 50%. Under erosion conditions, TBCs deposited at 0.012 mbar exhibited about 10% greater erosion resistance than those deposited at 0.006 mbar. Under impact conditions, the TBCs deposited at 0.012 mbar exhibited average spallation lives of about 1.3 times that of the lower pressure specimens. Accordingly, these experiments evidenced a trend that TBCs formed at higher pressures exhibit superior erosion and impact resistance.

Finally, the effect that the coating process parameters of this invention have on thermal conductivity was also evaluated. Test specimens having dimensions of about 0.5×0.5× 0.025 inch (12.7×12.7×0.635 mm) were machined from a René N5 substrate, surface treated to achieve a surface roughness of about 60 micrometers Ra, and then coated with a five mil (125 micrometers) thick EBPVD TBC. Thermal conductivity was calculated from the product of coating density, thermal diffusivity and specific heat. Coating density and thermal diffusivity are functions of coating microstructure (e.g., porosity level) while specific heat is mainly composition-dependent. Bulk coating density was calculated from weight gain and volume. Specific heat and thermal diffusivity were measured using differential scanning calorimetry and laser flash techniques, respectively, both of which were performed in accordance with ASTM standards.

The TBCs were processed in coating chambers maintained at a feed rate of about 1.7 or 2.1 mm/minute per ingot (an evaporation rate of about 20 to 24.6 g/minute per ingot, or a combined evaporation rate of 40 or 49.2 g/minute), an absolute pressure of either 0.006 or 0.015 mbar, and an oxygen partial pressure of either about 100% or 50%, respectively. The average thermal conductivity values at 1100° C. were 1.284 and 1.036 W/mK for the 0.006 and 0.015 mbar specimens, respectively, evidencing that coatings deposited at pressures within the scope of this invention exhibit significantly lower thermal conductivity as compared to coatings deposited at conventional coating pressures. Consequently, TBCs formed in accordance with this invention are able to provide better thermal insulation for the components on which they are deposited.

While our invention has been described in terms of a preferred embodiment, it is apparent that other forms could be adopted by one skilled in the art. Accordingly, the scope of our invention is to be limited only by the following claims.

What is claimed is:

1. A method for forming a ceramic layer on a component, the method comprising the steps of:

establishing an absolute pressure of at least 0.0143 mbar within a coating chamber containing a gas; and evaporating a metal oxide ceramic material with an electron beam focused on at least two ingots of the ceramic material so as to produce a vapor comprising metal ions and oxygen ions, the vapor being diffuse relative to the ingots of ceramic material so as to travel upwardly and outwardly from the ingots and then deposit on a surface of a component above the ingots within the coating chamber, the metal and oxygen ions recombining to form a layer of the ceramic material on the surface.

2. A method as recited in claim 1, further comprising the step of forming a bond coat on the surface of the component prior to forming the layer of ceramic material on the surface of the component.

3. A method as recited in claim 1, further comprising the step of grit blasting the surface of the component with an abrasive media having a particle size of about 250 to about 300 micrometers and at a pressure of greater than 55 psi.

4. A method as recited in claim 1, wherein the layer of the ceramic material is characterized by a feathery columnar microstructure.

5. A method as recited in claim 1, wherein the absolute pressure within the coating chamber is not higher than 0.020 mbar.

6. A method as recited in claim 1, wherein the gas is a mixture of oxygen and an inert gas.

7. A method as recited in claim 1, wherein the surface of the component is at a temperature of about 1000° C. to about 1140° C. as the vapor is deposited thereon during the evaporating step.

8. A method as recited in claim 1, wherein the ceramic material is evaporated at a rate of about 23.5 to about 29.2 grams/minute per ingot of the ceramic material.

9. A method as recited in claim 1, further including the step of preheating the surface of the component to a temperature of about 1100° C. prior to depositing the layer of ceramic material on the surface of the component.

10. A method as recited in claim 1, wherein the component is an airfoil.

11. A method as recited in claim 1, wherein the absolute pressure within the coating chamber is at least 0.015 mbar up to 0.0195 mbar.

12. A method for forming a thermal barrier coating on a component, the method comprising the steps of:

forming a bond coat on a surface of the component;

grit blasting the surface of the component with an abrasive media;

supporting the component within a coating chamber above two ingots of yttria-stabilized zirconia;

establishing an absolute pressure of at least 0.0143 mbar but not greater than 0.020 mbar within the coating chamber containing oxygen and an inert gas; and evaporating each of the ingots at a rate of about 23.5 to about 29.2 grams per minute with electron beams so as to produce a vapor of zirconium ions, yttrium ions, oxygen ions and nonstoichiometric metal oxides, the vapor being diffuse relative to the ingots so as to travel upwardly and outwardly from the ingots and then deposit on the surface of the component, the zirconium, yttrium and oxygen ions and the nonstoichiometric metal oxides recombining to form a layer of yttria-stabilized zirconia on the surface.

13. A method as recited in claim 12, wherein the bond coat is a diffusion aluminide bond coat.

14. A method as recited in claim 12, wherein the abrasive media has a particle size of about 54 mesh and is at a pressure of greater than 55 psi.

15. A method as recited in claim 12, wherein the absolute pressure within the coating chamber is at least 0.015 mbar.

16. A method as recited in claim 12, wherein the layer of yttria-stabilized zirconia is characterized by a feathery columnar microstructure.

17. A method as recited in claim 12, wherein the surface of the component is at a temperature of about 1000° C. to about 1140° C. as the vapor is deposited thereon during the evaporating step.

18. A method as recited in claim 12, further comprising the step of preheating the surface of the component to a temperature of about 1100° C. prior to depositing the layer of yttria-stabilized zirconia on the surface of the component.

19. A method as recited in claim 12, wherein the component is an airfoil.

20. A method for forming a thermal barrier coating on an airfoil, the method comprising the steps of:

forming a diffusion aluminide bond coat on a surface of the airfoil;

grit blasting the surface of the airfoil with an abrasive media having a particle size of about 54 mesh;

rotating the component within a coating chamber containing two ingots of yttria-stabilized zirconia;

establishing an absolute pressure of at least 0.015 up to 0.0195 mbar within the coating chamber containing oxygen and an inert gas;

preheating the surface of the component to a temperature of about 900° C. to about 1100° C.; and evaporating each of the ingots at a rate of about 24.6 grams/minute per ingot with electron beams so as to produce a vapor of zirconium ions, yttrium ions and oxygen ions and nonstoichiometric metal oxides, the vapor being diffuse relative to the ingots so as to travel upwardly and outwardly from the ingots and then deposit on the surface of the airfoil while the surface is at a temperature of about 1000° C. to about 1140° C., the zirconium, yttrium and oxygen ions and the nonstoichiometric metal oxides recombining to form a layer of yttria-stabilized zirconia on the surface, the layer of yttria-stabilized zirconia being characterized by a feathery columnar microstructure.

* * * * *